US012622196B2

(12) United States Patent
Mackh et al.

(10) Patent No.: US 12,622,196 B2
(45) Date of Patent: May 5, 2026

(54) WAFER, ELECTRONIC COMPONENT AND METHOD USING LASER PENETRATION AFFECTING STRUCTURE

(71) Applicant: Infineon Technologies AG, Neubiberg (DE)

(72) Inventors: Gunther Mackh, Neumarkt (DE); Adolf Koller, Regensburg (DE); Michael Kraus, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 839 days.

(21) Appl. No.: 17/886,077

(22) Filed: Aug. 11, 2022

(65) Prior Publication Data

US 2023/0066813 A1 Mar. 2, 2023

(30) Foreign Application Priority Data

Aug. 25, 2021 (DE) ..................... 10 2021 121 994.9

(51) Int. Cl.
*H01L 21/78* (2006.01)
*H01L 21/268* (2006.01)
*H01L 23/00* (2006.01)

(52) U.S. Cl.
CPC ............ *H01L 21/78* (2013.01); *H01L 21/268* (2013.01); *H01L 23/562* (2013.01)

(58) Field of Classification Search
CPC ..... H01L 21/78; H01L 21/268; H01L 23/562; H01L 21/561; H01L 23/552
See application file for complete search history.

(56) References Cited

U.S. PATENT DOCUMENTS

| | | | |
|---|---|---|---|
| 10,796,899 B2 | 10/2020 | Espina | |
| 2004/0137702 A1 | 7/2004 | Lijima et al. | |
| 2007/0066044 A1 | 3/2007 | Abe et al. | |
| 2009/0149002 A1 | 6/2009 | Watanabe et al. | |
| 2014/0217577 A1 | 8/2014 | Mackh | |
| 2017/0033768 A1 | 2/2017 | Aigner et al. | |
| 2017/0053832 A1 | 2/2017 | Wan et al. | |
| 2018/0069079 A1 | 3/2018 | Fanelli et al. | |
| 2018/0122754 A1* | 5/2018 | Tatour ................... | H01L 23/585 |
| 2020/0294856 A1 | 9/2020 | Ono et al. | |
| 2021/0202318 A1* | 7/2021 | Ko ........................... | H01L 25/50 |
| 2022/0399234 A1* | 12/2022 | Chuang ................. | H01L 21/268 |

FOREIGN PATENT DOCUMENTS

DE 10 2014 101 283 8/2014

\* cited by examiner

*Primary Examiner* — Thanh T Nguyen
(74) *Attorney, Agent, or Firm* — Dicke, Billig & Czaja, PLLC

(57) ABSTRACT

A wafer, electronic component and method are disclosed. In one example, the wafer comprises an array of a plurality of electronic components. The separation frame separating neighboured electronic components, wherein the separation frame comprises a laser penetration affecting structure configured for locally affecting laser penetration when subjecting the separation frame to laser processing during stealth dicing.

17 Claims, 2 Drawing Sheets

WAFER, ELECTRONIC COMPONENT AND METHOD USING LASER PENETRATION AFFECTING STRUCTURE

CROSS-REFERENCE TO RELATED APPLICATION

This Utility Patent Application claims priority to German Patent Application No. 10 2021 121 994.9, filed Aug. 25, 2021, which is incorporated herein by reference.

BACKGROUND OF THE INVENTION

The present invention relates to a wafer, an electronic component, and a method of separating electronic components from a wafer.

Packages may be denoted as for example encapsulated electronic chips with electrical connects and being mounted to an electronic periphery, for instance on a printed circuit board. Before packaging, a semiconductor wafer is singularized into a plurality of electronic chips. After singularizing the wafer into the singularized electronic chips, the electronic chips of the wafer may be subsequently used for further processing.

Singularization may be accomplished by mechanically or laser cutting the wafer. However, separated electronic components may be damaged during separation.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION

Figures 1, 2, 3, 4:
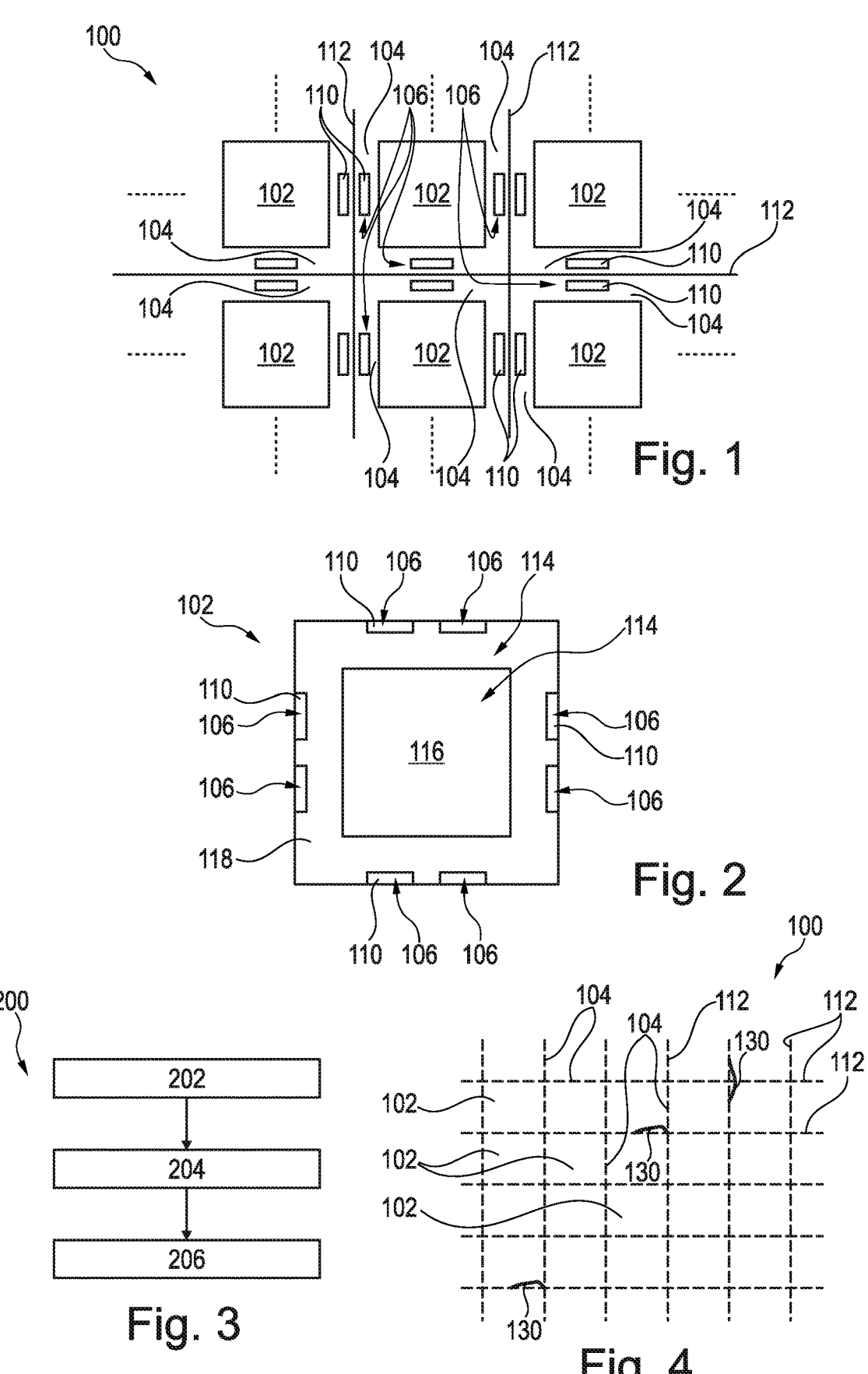
FIG. 1 shows a plan view of a wafer according to an exemplary embodiment.
FIG. 2 shows a plan view of an electronic component according to an exemplary embodiment.
FIG. 3 shows a flowchart of a method of separating electronic components from a wafer according to an exemplary embodiment.
FIG. 4 shows a plan view of a wafer according to an exemplary embodiment.

There may be a need to separate electronic components from a wafer with low risk of damage.

According to an exemplary embodiment, a wafer is provided which comprises an array of a plurality of electronic components, and a separation frame separating neighboured electronic components, wherein the separation frame comprises a laser penetration affecting structure configured for locally affecting laser penetration when subjecting the separation frame to laser processing during stealth dicing.

According to another exemplary embodiment, an electronic component is provided which comprises a semiconductor body, an active region in and/or on a central portion of the semiconductor body, and a separation frame structure in an edge region of the semiconductor body, wherein the separation frame structure comprises a laser penetration affecting structure configured for locally affecting laser penetration during subjecting the separation frame structure to laser processing during stealth dicing.

According to still another exemplary embodiment, a method of separating electronic components from a wafer is provided, wherein the method comprises providing the wafer with a separation frame separating neighboured electronic components, providing the separation frame with a laser penetration affecting structure, and subjecting the laser penetration affecting structure to laser processing during stealth dicing along the separation frame for locally affecting laser penetration.

According to an exemplary embodiment, separation of a wafer into individual electronic components, which are previously integrally connected in the wafer compound and spaced by a separation frame, may be carried out with a reduced risk of damage thanks to the implementation of a dedicated laser penetration affecting structure formed in the separation frame. During stealth dicing, a wafer may be separated into electronic components by firstly mechanically weakening the separation frame by laser processing and by subsequently disrupting the laser-weakened separation frame for obtaining individual electronic components. By integrating said laser penetration affecting structure as a hardware feature in the separation frame, laser processing in terms of stealth dicing may be controlled more precisely by affecting the laser beam in the region of the laser penetration affecting structure in a controlled and different way as compared to a region of the separation frame apart from the laser penetration affecting structure. Preferably but not necessarily, the laser penetration affecting structure may locally weaken the impact of the laser beam on the material of the separation frame. Hence, by structurally adjusting the separation frame for controlling laser impact in accordance with a design of the laser penetration affecting structure, undesired phenomena and thus damage of the wafer and/or its separated electronic components may be reliably prevented. This may improve the yield at a high throughput. Furthermore, due to the structural implementation of the laser penetration affecting structure and the separation frame, it may be ensured that the laser beam impinging on the separation frame is affected in a spatially defined way without the need of individually inspecting separated electronic components by a human operator in a cumbersome way. Hence, a laser penetration affecting structure-based adjustment of the stealth dicing process may be more reliable and may involve less effort in comparison with a spatially dependent control of the laser beam and its properties. In contrast to exemplary embodiments, the latter approach may require manual and individual control of an actual impact of the controlled laser beam on the quality of the separated electronic components. Descriptively speaking, an exemplary embodiment may interrupt (partially or entirely) a laser impact (preferably without interrupting the laser beam itself) by a hardware design in the separation frame in form of the laser penetration affecting structure for selectively shadowing or shielding the laser beam from one or more well-defined portions of the wafer or electronic component. In view of its impact on laser penetration, in a region of the separation frame in which the laser penetration affecting structure is present, a number of defects may be smaller in comparison with another region of the separation frame in which the laser penetration affecting structure is absent. In particular, this may allow to reduce an amount of laser cut spots (such as candle sticks) and a related (or resulting) defect density in one or more dedicated regions of the separation frame.

In the following, further exemplary embodiments of the wafer, the electronic component, and the method will be explained.

Preferably, a laser spot density can be selected just so high that a complete separation with straight separation lines may take place. More spot density might only cost process time, might cost defect density and might cost breaking strength. However, the minimum desired or required density of spots may be not the same over the separation lines, and even within a separation line. Especially, it may be different between intersection areas and outside. This may lead to advantageous separation results.

In the context of the present application, the term "wafer" may particularly denote a semiconductor substrate which has been processed to form a plurality of integrated circuit elements in an active region of the wafer and which may be singularized into a plurality of separate electronic components or chips. For example, a wafer may have a disk shape and may comprise a matrix-like arrangement of electronic components in rows and columns. It is possible that a wafer has a circular geometry or a polygonal geometry (such as a rectangular geometry or a triangular geometry).

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a pressure sensor, a light sensor or a gas sensor), an actuator (for instance a loudspeaker), and a microelectromechanical system (MEMS, for instance a loudspeaker, a member comprising a mechanical spring, etc.). However, in other embodiments, the electronic component may also be of different type, such as a mechatronic member, in particular a mechanical switch, etc.

In the context of the present application, the term "separation frame" may particularly denote a physical structure of a wafer between adjacent integrally connected electronic components. For instance, such a separation frame may comprise straight sections running along rows and columns and being connected with each other in intersection or crossing regions.

In the context of the present application, the term "separation frame structure" may particularly denote a portion of a separation frame, for instance an annular portion of a separation frame forming an exterior ring of an individual electronic component of the wafer from which said electronic component is separated.

In the context of the present application, the term "separating" may particularly denote the procedure of singularizing a plurality of separate electronic components from an integral wafer as sections of the previous wafer. Such a separation or singularization may be accomplished in particular by stealth dicing.

In the context of the present application, the term "laser penetration affecting structure" may particularly denote a dedicated structural feature in the separation frame being specifically configured for affecting a laser beam propagating to the separation frame in a different way at the laser penetration affecting structure as compared to another region of the separation frame apart from the laser penetration affecting structure. More specifically, the laser penetration affecting structure may selectively attenuate penetration of the laser beam into the laser penetration affecting structure in a depth direction more strongly compared with a penetration of the laser beam into the separation frame apart from the laser penetration affecting structure. For instance, the material, material composition, surface roughness and/or any other attribute of the laser penetration affecting structure may be configured for affecting and in particular suppressing laser penetration. In particular, the laser penetration affecting structure may defocus a laser beam which would otherwise be focused to a specific depth level in the frame structure in the region of the laser penetration affecting structure. By taking this measure, the laser penetration affecting structure may specifically control laser impact on the separation frame in a spatially dependent way. Preferably, substructures of the laser penetration affecting structure relating to a separation line according to which electronic components of a wafer are to be separated by stealth dicing is arranged symmetrically with respect to such a separation line or with respect to a corresponding straight section of the separation frame.

In the context of the present application, the term "stealth dicing" may particularly a technology for separating a wafer into electronic components by firstly laser processing the wafer along desired separation lines and by subsequently disrupting the laser processed wafer along said laser-defined separation lines by a mechanical impact, in particular a tensile force. Stealth dicing may denote in particular a two-stage process in which defect regions are firstly introduced into a wafer by scanning a laser beam along intended cutting lines, and secondly the wafer may be expanded (in particular an underlying carrier membrane on which the wafer may be mounted may be expanded) to induce fracture of the wafer for separation into the individual electronic components thereof. In particular, stealth dicing may comprise laser processing a wafer along a separation frame, and then continuing with the stealth dicing after the laser processing by expanding the wafer to induce fracture at the separation frame to thereby separate the electronic components.

In the context of the present application, the term "separation line" may particularly denote a preferably straight trajectory along which the wafer is separated for separating the individual electronic components from the wafer compound. For instance, a separation line may be a linear path along which a laser beam moves and subsequent disruption of the wafer occurs during chip separation.

In the context of the present application, the term "active region" may particularly denote a surface region of a semiconductor body of a wafer or an electronic component, in and/or on which surface region at least one monolithically integrated circuit element is formed. In particular, such an active region may form a surface region of a wafer or an electronic component at a front side thereof.

A gist of an exemplary embodiment can be seen in the reduction of a defect density at stealth dicing by the provision of a laser penetration affecting structure which may be designed for causing laser spot interruptions. More specifically, such a laser penetration affecting structure may be designed to achieve one or more laser spot interruptions by a separation line (or scribe line) design which re-uses design elements of the chip circuit design and layer stack to affect the laser penetration into the bulk silicon of the wafer and its electronic components.

In an embodiment, the laser penetration affecting structure is a defect density suppression structure for locally suppressing formation of defects during separating the electronic components from the wafer. Correspondingly, the laser penetration affecting structure of an electronic component may be a defect density suppression structure for suppressing formation of defects during separating the electronic component from a wafer. What concerns for instance MEMS (microelectromechanical structure)-type electronic components, stealth dicing may create defects in the separation frame so that particles of dimensions in the order of magnitude of several micrometers may be discharged or released during separation and may be unintentionally clamped between movable parts of the MEMS. This may deteriorate or even damage the function of the MEMS-type electronic components. To avoid this, the laser penetration affecting structure may be configured for suppressing creation of such defective particles by appropriately affecting penetration of the laser beam into the material of the separation frame in a region of the laser penetration affecting structure.

The previously described embodiment may be implemented in particular advantageously when a thickness of the semiconductor body is at least 300 μm, in particular is in a range from 300 μm to 1 mm, or even more. With such relatively thick wafers and electronic components (typical for MEMS applications), the risk of formation of an excessive amount of defects in form of micrometer-dimensioned particles being separated from the semiconductor body by laser processing in terms of stealth dicing may be particularly pronounced. Descriptively speaking, the larger a thickness of an electronic component, the larger is a sidewall area and the larger may be a number of candle sticks leading to the formation of defective particles upon disrupting a wafer into individual electronic components. In such a scenario, the provision of a laser penetration affecting structure embodied as defect density suppression structure may be particularly advantageous.

In an embodiment, the laser penetration affecting structure is a breaking strength enhancement structure for enhancing a breaking strength during separating the electronic components from the wafer. Accordingly, the laser penetration affecting structure of an electronic component may be a breaking strength enhancement structure for enhancing a breaking strength during separating the electronic component from a wafer. In particular in an embodiment relating to very thin wafers and electronic components, separation by stealth dicing may involve a considerable risk of breakage. By configuring the laser penetration affecting structure for enhancing breaking strength, the risk of damage by separation of electronic components from a very thin wafer and a separation along undesired trajectories may be significantly reduced.

The previously described embodiment may be implemented in particular advantageously when a thickness of the semiconductor body is not more than 300 μm, in particular is in a range from 100 μm to 300 μm. With such relatively thin wafers, the risk of breakage during stealth dicing may be particularly pronounced. Hence, the provision of a laser penetration affecting structure configured for enhancing breaking strength may be particularly advantageous.

In an embodiment, the laser penetration affecting structure comprises a pattern configured for trimming a laser beam during stealth dicing. Such a pattern may be a physical structure having an impact on the interaction with the laser beam to thereby shape the laser beam penetrating into the separation frame. Also the focusing properties of the laser beam in an interior of the separation frame may be trimmed by the laser penetration affecting structure. For instance, a focus point of a laser beam at a specific depth level in the separation frame may be intentionally disturbed by the laser penetration affecting structure in a spatially dependent way. Thus, an excessive energy impact in a portion of the separation frame assigned to the laser penetration affecting structure may be avoided, thereby for instance decreasing defect density.

In an embodiment, the laser penetration affecting structure is configured for locally blocking a laser beam when irradiated onto this portion of the separation frame. Hence, the laser beam may be prevented from entering the separation frame in the region of the laser penetration affecting structure, or the intensity of the laser beam in the region of the laser penetration affecting structure may be strongly decreased in comparison with a region of the separation frame apart from the laser penetration affecting structure.

In an embodiment, the laser penetration affecting structure comprises or consists of a metallic structure for reflecting a laser beam. Hence, the laser penetration affecting structure may be a metallic pattern. Such a metallic pattern may reflect or block at least the major portion of the laser beam selectively in the regions of the separation frame at which the metallic pattern is present. Since semiconductor processing stages (for instance in the back end of the line, BEOL) usually comprise metal formation stages, the laser penetration affecting structure may be formed simultaneously with and as part of an active region formation process forming an active region of the electronic components of the wafer. Hence, the laser penetration affecting structure may be produced efficiently and substantially without extra effort in the described way.

In an embodiment, the laser penetration affecting structure comprises or consists of a locally highly doped region for absorbing a laser beam. For instance, a dopant may be selectively introduced into a region of the laser penetration affecting structure, but not into other portions of the separation frame apart from the laser penetration affecting structure. Such a dopant may be a trace of an impurity element that is introduced selectively into the laser penetration affecting structure of the separation frame and which locally alters the properties of the semiconductor body, and in particular its properties in terms of interaction with a laser beam. When implanted into crystalline substances (in particular a semiconductor such as silicon or germanium), the dopant atoms get incorporated into the crystal lattice. However, the dopant may also be introduced into a non-crystalline or poly-crystalline substance. When the semiconductor body is a group IV material (such as silicon), the dopant atoms may be in particular of a group III material (such as boron) or a group V material (such as antimony). It is also possible that the dopant atoms comprise both a group III material and a group V material. In yet another embodiment, the dopant atoms may form a counter-doping (i.e. may be of inverse dopant type) as compared to the semiconductor substrate. Selectively doping the laser penetration affecting structure in comparison with the rest of the separation frame may lead to a selective absorption of laser radiation by the laser penetration affecting structure. This may suppress propagation of the laser beam into lower depth levels of the separation frame selectively beneath the laser penetration affecting structure.

In an embodiment, the laser penetration affecting structure comprises or consists of a dielectric material having a different dielectric constant compared to surrounding material to thereby manipulate a focus position, in particular a focus depth, of the laser beam. For instance, a focus point may be changed by adjusting dielectric properties. For example, a thick layer with a high dielectric constant can shift the focus point of the laser beam further away from the surface. For instance, the lowest spot can then be no longer within the bulk material.

In a specific embodiment, when different dielectric materials with different values of the dielectric constant are present in the separation frame and in particular in its laser penetration affecting structure, interference phenomena may occur upon interacting with the laser beam. For instance, different structures of dielectric materials with different values of the dielectric constants may form a Bragg grating. Consequently, electromagnetic laser radiation may experience constructive and destructive interference which may be adjusted by correspondingly selecting shape, dimension and dielectric constant of the dielectric materials. By taking this measure, the laser focusing properties may be manipulated in certain regions and laser penetration may thus be locally strongly attenuated.

In an embodiment, the laser penetration affecting structure has a locally increased surface roughness compared to surrounding material to thereby defocus a laser beam. By selectively roughening a surface of the separation frame only in the region of the laser penetration affecting structure, the laser beam may be intentionally disturbed at the local extension of the laser penetration affecting structure, and local scattering may be triggered. As a result, defocusing of the laser beam selectively in the region of the laser penetration affecting structure may be achieved.

In an embodiment, the laser penetration affecting structure is configured for affecting laser penetration in different ways at different depth levels inside of the separation frame. Such an embodiment is shown in particular in FIG. 7. During laser processing in terms of stealth dicing, the laser beam may be focused sequentially to different depth levels of the separation frame. Consequently, laser cut portions (also denoted as candle sticks) may be formed at different specific depth levels of the separation frame, and particles may be discharged or released from the separation frame during a mechanical separation following laser processing. Descriptively speaking, semiconductor material may locally melt temporarily at the laser cut portions. By correspondingly configuring the laser penetration affecting structure, the laser impact on different depth levels of the separation frame may be adjusted individually, thereby further refining controllability of the laser impact.

When forming candle sticks at different depth levels of a wafer or an electronic component during laser processing in terms of stealth dicing, it may be preferred to first focus the laser beam to the deepest depth level, thereafter to the second deepest depth level, and so on, until the laser beam is focused on the end of the laser processing to the shallowest depth level. This sequence or order may avoid that a shallow depth is unintentionally affected in a disturbing way by laser processing at a deeper level. For example, candle sticks may be formed at depth levels of 200 μm, 100 μm, and 30 μm below the upper surface of the wafer or electronic components.

In an embodiment, the laser penetration affecting structure comprises a pattern of substructures located along one or more straight separation lines of the separation frame. In other words, a plurality of substructures of the laser penetration affecting structure may be arranged along a straight line (compare FIG. 6). This allows to adjust a laser impact during a straight motion of a laser beam along a straight separation line of the separation frame.

Figures 5, 6, 7:
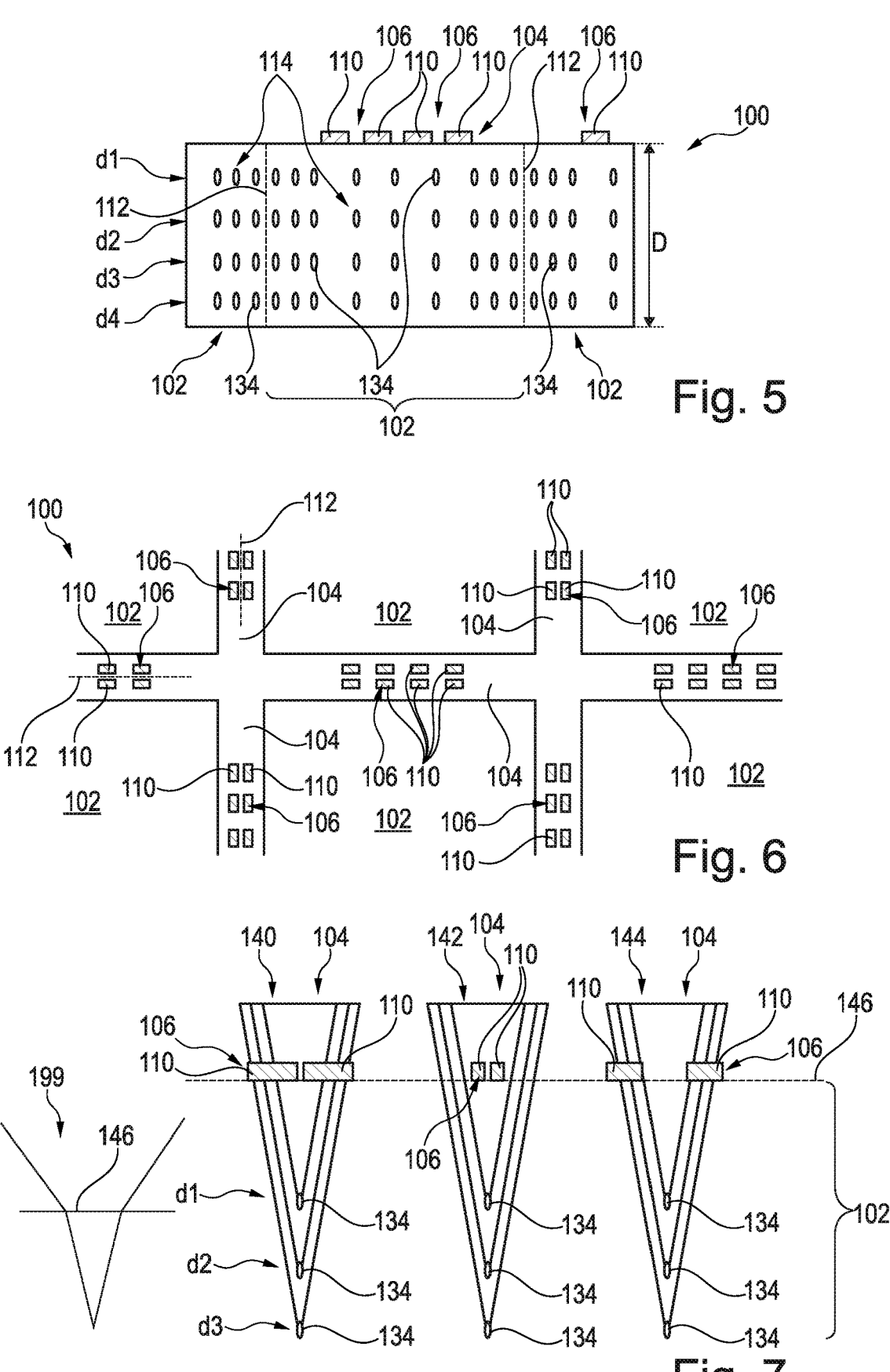
FIG. 5 shows a cross-sectional view of a wafer comprising electronic components to be separated according to an exemplary embodiment.
FIG. 6 shows a plan view of a wafer according to an exemplary embodiment.
FIG. 7 shows a cross-sectional view of a wafer according to an exemplary embodiment.

In an embodiment, the pattern is a regular pattern of substructures. For instance, the regular pattern of substructures may be a periodic pattern of repeating substructures (compare again FIG. 6 showing an example).

In an embodiment, the pattern is absent in crossing regions of the separation frame. In crossing regions of the separation frame which correspond to corners of the electronic components to be separated, the risk of damage during separation by disruption of the laser processed wafer is particularly pronounced (see reference sign 130 in FIG. 4 for illustration). Descriptively speaking, actual separation trajectories may deviate from target separation lines in corners of the individual electronic components. In addition, defective particles may be discharged or released during expanding the wafer for disruption, and such particles may create artefacts (in particular may be introduced between movable parts of a MEMS-type electronic component and may deteriorate the mechanical function thereof). Therefore, it may be advantageous to arrange the laser penetration affecting structure along edges (preferably along edges along two perpendicular directions) of the electronic components. In these regions, separation by stealth dicing is less critical, and thus a reduction of the laser penetration—and consequently a reduction of a defect density—may improve the reliability of the separated electronic components without compromising on a high quality separation. In contrast to this, it may be advantageous to refrain from reducing laser penetration by the laser penetration affecting structure in said crossing regions of the separation frame corresponding to corner regions of the electronic components, since here cutting artefacts according to reference sign 130 in FIG. 4 may be the major issue.

In an embodiment, the substructures comprise a plurality of stripe pairs, each stripe pair having a spacing between its two stripes. A laser beam-related separation line may correspond to the spacing between the stripes of the stripe pairs. More specifically, said laser beam-related separation line may extend along spacings of stripe pairs arranged along a straight line. Preferably, different ones of the stripe pairs may be spaced along a respective one of the one or more straight separation lines. Descriptively speaking, such a geometry may lead to an efficient laser impact between adjacent stripe pairs and an intentionally less efficient laser impact at a respective spacing between stripes of a respective stripe pair.

In an embodiment, the electronic component is configured as microelectromechanical system (MEMS). MEMS components may be tiny integrated devices that combine mechanical and electrical components. MEMS components may be fabricated using integrated circuit batch processing techniques and can range in size from a few micrometers to millimeters. Examples for MEMS-type electronic components are microphones, members comprising at least one mechanical spring, microelectromechanical pressure sensors, etc.

In an embodiment, the laser penetration affecting structure is arranged along at least part of each of four exterior edges of the semiconductor body. Separation accuracy by stealth cutting may be less critical along straight surrounding edges of the semiconductor body, so that a selective weakening of the laser impact on the separation frame by the laser penetration affecting structure may be advantageously here for suppressing defect density.

In an embodiment, the laser penetration affecting structure is absent in each of four exterior corner regions of the semiconductor body. Since separation accuracy of the wafer into individual electronic components by stealth dicing may be more critical in corner regions of the electronic components as compared to edge regions, the separation frame may be free of a laser penetration affecting structure in intersection regions between perpendicular extending straight sections of the separation frame. Consequently, the laser impact may be non-attenuated and thus selectively strong at corners of the electronic components to be separated. This increases the reliability of correct separation of the electronic components in its corner regions.

In an embodiment, the method comprises carrying out the laser processing by guiding a laser beam along the separation frame in a first direction and in a second direction transverse to (in particular perpendicular to) the first direction. By this approach, separation of a matrix-like array of electronic components in rows and columns of a wafer may be accomplished.

In an embodiment, the method comprises carrying out the laser processing by guiding a laser beam a plurality of times along the separation frame for impacting the wafer at different depth levels. Each time of passing a respective straight portion of the separation frame, a straight array of cutting spots (candle sticks) may be formed at a respective depth level to which the laser beam may be focused. By repeatedly passing a respective straight portion, the laser beam may be focused to different depth levels so that a plurality of straight arrays of candle sticks may be formed. This allows to properly separate the individual electronic components from the wafer.

In an embodiment, the method comprises carrying out the laser processing by guiding a laser beam along the separation frame so that penetration of the laser beam into the wafer is at least partially blocked by the laser penetration affecting structure. In other words, the laser penetration affecting structure may be configured (for instance by making it of a metal) for blocking a larger amount of the laser energy as compared to other regions of the separation frame apart from the laser penetration affecting structure.

In an embodiment, the method comprises carrying out the laser processing by guiding a laser beam along the separation frame so that penetration of the laser beam into the wafer occurs more efficiently apart from the laser penetration affecting structure as compared to penetration of the laser beam into the wafer at the laser penetration affecting structure. Hence, penetration of the laser beam into an interior of the separation frame may be inhibited by the laser penetration affecting structure.

In an embodiment, the method comprises carrying out the laser processing by guiding a laser beam continuously along the separation frame. Thus, the laser beam may scan uninterruptedly along the separation frame. Hence, a complex control of the laser energy over time impacting a separation frame may be dispensable. In contrast to this, laser trimming for affecting laser penetration in a spatially dependent way may be accomplished according to exemplary embodiments by the hardware design of the separation frame in form of the provision of the laser penetration affecting structure.

However, in alternative embodiments, it may also be possible to control laser intensity during laser processing, for instance by repeatedly switching on and switching off the laser beam.

In an embodiment, the method comprises forming the laser penetration affecting structure simultaneously with a process of forming a structural feature of an active region of the electronic components. For forming a functionally active region of an electronic component, various processing stages may be executed (for instance comprising in particular front end of the line (FEOL) processing and back end of the line (BEOL) processing). Such semiconductor processing for creating the active region may in particular comprise the formation of patterned metal layers. Highly advantageously, such an active region formation process may be used for simultaneously forming the laser penetration affecting structure on and/or in the separation frame. Hence, the laser penetration affecting structure may be formed substantially without extra effort.

In an embodiment, the electronic component is a power semiconductor chip. Such a power semiconductor chip may have integrated therein one or multiple integrated circuit elements such as transistors (for instance field effect transistors like metal oxide semiconductor field effect transistors and/or bipolar transistors such as insulated gate bipolar transistors) and/or diodes. Exemplary applications which can be provided by such integrated circuit elements are switching purposes. For example, such another integrated circuit element of a power semiconductor device may be integrated in a half-bridge or a full bridge. Exemplary applications are automotive applications.

The one or more electronic components (in particular semiconductor chips) may comprise at least one of the group consisting of a diode, and a transistor, more particularly an insulated gate bipolar transistor. For instance, the one or more electronic chips may be used as semiconductor chips for power applications for instance in the automotive field. In an embodiment, at least one semiconductor chip may comprise a logic IC or a semiconductor chip for RF power applications. In one embodiment, the semiconductor components may be used as one or more sensors or actuators in microelectromechanical systems (MEMS), for example as pressure sensors or acceleration sensors, as a microphone, as a loudspeaker, etc.

As substrate or wafer for the semiconductor components, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Stealth dicing may be a preferred choice for separating MEMS-type electronic components from a wafer. In particular, stealth dicing may be sometimes the only possible separation technique which is able to handle such devices without humidity impact, without touching the sensitive wafer frontside and without applying mechanical vibrations.

Depending on its feature sizes, MEMS-type electronic components may be extremely sensitive to defect density which may affect the movements of micromachined elements and may end up in high yield loss and high detection efforts to detect and screen such particles.

However, stealth dicing may lead to higher defect density than other dicing methods because of particles which get split off from the separated chip sidewalls. The number of defects depends on the number of focused laser spots forming so-called candle sticks in the sidewall of a respective electronic component. Therefore, a minimization of this spot number may be desirable to avoid an undesired impact on movable parts of a separated MEMS-type electronic component.

Especially in the case of thick wafers, the reduction in defect density is desired. The defect density is proportional to the number of focus spots (candle sticks). In thinner wafers, the breaking strength plays a role as well. This is particularly relevant for stealth dicing, as the separation method stealth dicing may be less suitable than conventional sawing methods, especially in terms of breaking strength and defect density. But often only stealth dicing is suitable as a sawing method with MEMS.

One possibility of reducing such defects is using a stealth laser with very high power needing less spots both in horizontal and vertical direction. Nevertheless, for large dies and small sensitive micromechanical elements there may be still the need to reduce the defect density even further. For example, for large electronic components (for instance having an area of several hundred square millimeters), defect particles of a size of a few micrometer may already lead to a severe yield loss.

A desired reduction of spots can also be realized via optimization of the positioning of the stealth spots. It may be desired that stealth spot density is higher at chip edges than far away from the chip edges. This is derived from the fact that uneven breaking lines deviating from the spot position at a scribe line center may occur predominantly near the chip corners (see the top view of FIG. 4).

Controlling a laser beam for switching it on and off during scanning along a separation frame of the wafer for adjusting stealth spots may be usually cumbersome. Since there is no process feedback concerning the success and spatial accuracy of such an approach of switching the laser beam on and off during scanning along a separation frame, a cumbersome manual inspection of the individual electronic components may be necessary.

According to an exemplary embodiment, a separation frame of a wafer may be equipped with a laser penetration affecting structure for controlling in a spatially dependent way laser penetration into a corresponding portion of the separation frame during singularization of the wafer into individual electronic components without complicated control of the laser beam. Advantageously, such a laser penetration affecting structure may be provided for reducing defect density in an electronic component separated from a wafer compound by stealth dicing. In particular, an exemplary embodiment may implement stealth laser spot interruptions via a separation line (or scribe line) design which re-uses design elements of the chip circuit design and layer stack to affect the laser penetration into the bulk silicon. Such an approach may be applied in particular advantageously for MEMS-type electronic components which may be separated efficiently by stealth dicing. It may be particularly preferred to implement exemplary embodiments for separating electronic components with large die sizes and with high requirements on defect density.

Advantageously, an exemplary embodiments creates laser spot interruptions by a scribe or separation line design which re-uses design elements of the chip circuit design and layer stack to affect the laser penetration into the bulk silicon. The used layers may have a placement accuracy which is much better than 1 µm. Advantageously, such design elements can be implemented without additional effort.

In an embodiment, the design of the laser penetration affecting structure may be supported by a simulation for optimization.

FIG. 1 shows a plan view of part of a wafer 100 according to an exemplary embodiment.

The illustrated wafer 100 comprises an array of a plurality of electronic components 102. Furthermore, wafer 100 comprises a separation frame 104 separating neighboured electronic components 102. As shown, the separation frame 104 comprises a laser penetration affecting structure 106 (which may have several substructures 110) configured for locally affecting laser penetration when subjecting the separation frame 104 to laser processing (in particular for separating along separation lines 112) during stealth dicing.

FIG. 2 shows a plan view of an electronic component 102 according to an exemplary embodiment.

The illustrated electronic component 102 comprises a semiconductor body 114. An active region 116 is formed in and/or on a central portion of the semiconductor body 114. Furthermore, the electronic component 102 comprises a separation frame structure 118 in an edge region of the semiconductor body 114. As shown, the separation frame structure 118 comprises a laser penetration affecting structure 106 configured for locally affecting laser penetration during subjecting the separation frame structure 118 to laser processing during stealth dicing.

FIG. 3 shows a flowchart 200 of a method of separating electronic components 102 from a wafer 100 according to an exemplary embodiment. For the description of FIG. 3, reference signs according to FIG. 1 and FIG. 2 will be used.

As shown by a block 202, the method may comprise providing the wafer 100 with a separation frame 104 separating neighboured electronic components 102.

As shown by a block 204, the method may further comprise providing the separation frame 104 with a laser penetration affecting structure 106.

As shown by a block 206, the method may additionally comprise subjecting the laser penetration affecting structure 106 to laser processing during stealth dicing along the separation frame 104 for locally affecting laser penetration.

FIG. 4 shows a plan view of a wafer 100 according to an exemplary embodiment. As indicated by reference signs 130, separation of the wafer 100 into individual electronic components 102 by stealth dicing may involve issues with uneven separation edges deviating from straight separation lines 112 along which a laser beam may be moved. The artefacts according to reference signs 130 may occur predominantly in corner regions of the electronic components 102 to be separated.

Hence, FIG. 4 shows a raster scanned by a laser beam during stealth dicing. During separation by disrupting wafer 100, separation cracks shall extend along said raster. However, it may occur in particular in corner regions of separated electronic components 102 that a crack during separation takes an undesired shortcut, see reference signs 130.

FIG. 5 shows a cross-sectional view of a wafer 100 with electronic components 102 according to an exemplary embodiment.

Referring to FIG. 5 and additionally FIG. 2, properties of an electronic component 102 according to an exemplary embodiment will be explained.

Such an electronic component 102 may comprise a semiconductor body 114, such as a silicon block. The semiconductor body 114 may initially form part of a semiconductor (in particular silicon) wafer 100 from which electronic components 102 may be separated by stealth dicing.

In and/or on an upper central region of the semiconductor body 114, an active region 116 may be monolithically integrated, for instance by semiconductor technology. Formation of the active region 114 may also include formation of a microelectromechanical system (MEMS) with mutually movable mechanical parts which may also provide an electric feature or function. For instance, the MEMS-type active region 114 may provide a microphone function in which an acoustic wave-triggered movement of a membrane is converted into an electric signal. Many other MEMS applications are however possible and known, as such, by a person skilled in the art.

As better seen in FIG. 2, a separation frame structure 118—initially forming part of a separation frame 104 of a wafer 100 from which the electronic component 102 has been separated—extends as an annularly closed structure along an edge region of the semiconductor body 114 and surrounds the active region 116. Advantageously, and as also illustrated in FIG. 5, the separation frame structure 118 comprises a laser penetration affecting structure 106 configured for locally affecting laser penetration into the separation frame structure 118 during subjecting the separation frame structure 118 to laser processing during stealth dicing for separating the electronic component 102 from the wafer 100. Hence, the presence of the laser penetration affecting structure 106 along straight edges of the separation frame structure 118 is a fingerprint of a respective electronic component 102 for its separation from wafer 100 by stealth dicing according to exemplary embodiments.

Again referring to FIG. 2, the laser penetration affecting structure 106 is arranged along parts of each of four exterior straight edges of the semiconductor body 114 having rectangular main surfaces. In contrast to this, the laser penetration affecting structure 106 is absent in each of four exterior corner regions of the semiconductor body 114. Each of said for corner regions is formed at an intersection of two perpendicular of said four exterior straight edges. As a result of the omission of the laser penetration affecting structure 106 in the corner regions, precise separation in the corner regions may be ensured for preventing artefacts as shown with reference signs 130 in FIG. 4. At the same time, defect formation may be suppressed along the edges thanks to the presence of the laser penetration affecting structure 106 at the edges. This can be best seen in FIG. 5 in which a plurality of candle sticks 134 are shown which are created in a sidewall of the electronic component 102 due to laser processing in terms of stealth dicing. In the shown embodiment, the candle sticks 134 are formed at different depth levels d1, d2, d3, d4 by repeating scanning of the laser beam along a separation frame 104 with a focus at the different depth levels d1, d2, d3, d4. Such candle sticks 134 may be formed as spots in sidewalls of the electronic components 102 at which a laser beam impacting a wafer 100 during stealth dicing leads to cutting. Upon disrupting the wafer 100 at said sidewalls, particles of typical dimensions of several micrometers may be released or discharged from the candle sticks 134 and may unintentionally clamp between mutually movable parts of the MEMS-type electronic component 102 for disturbing or damaging its function. By arranging—preferably metallic—substructures 110 of the laser penetration affecting structure 106 according to FIG. 5 for locally blocking a laser beam, a laser impact on corresponding portions of the separation frame structure 118 may be inhibited so that the density of candle sticks 134 is reduced where substructures 110 of the laser penetration affecting structure 106 is present. This can be seen in FIG. 5.

More specifically, FIG. 5 shows a locally higher density of candle sticks 134 in corners (i.e. at separation lines 112) of a respective electronic component 102 as compared to a locally lower density of candle sticks 134 along edges between corners of a respective electronic component 102. This is due to the presence of substructures 110 of the laser penetration affecting structure 106 along edges and due to their absence at corners. Consequently, the laser penetration affecting structure 106 functions as defect density suppression structure for suppressing formation of defects during separating the electronic component 102 from a wafer 100. Each candle stick 134 is a potential source of particles, and thus defects, discharged during separation of the wafer 100 by expansion. Locally decreasing the density of candle sticks 134 along the edges ensures a smaller defect density along the edges. Simultaneously, a high separation accuracy in the corners can be obtained as well. This may protect movable parts of the MEMS-type electronic component 102 against blockage by discharged particles and may simultaneously suppress artefacts 130 related to uneven breaking lines in corners (compare FIG. 4).

Again referring to FIG. 5, a thickness D of the semiconductor body 114 may be for example 700 μm or more. Such a high thickness is typical for MEMS applications. For such thick electronic components 102 with correspondingly large sidewall areas and hence high amounts of candle sticks 134 the described defect density reducing impact of the laser penetration affecting structure 106 may be of utmost advantage.

When, in other embodiments, thickness D is for instance as low as 200 μm, a bottleneck may be a limited breaking strength of the wafer 100 and its electronic components 102. Hence, electronic chips 102 separated from the wafer 100 of such a small thickness may be prone to breakage at undesired positions during separation. In order to tackle such a challenge, it may be possible to configure the laser penetration affecting structure 106 as a breaking strength enhancement structure for enhancing a breaking strength during separating the electronic component 102 from a wafer 100.

FIG. 6 shows a plan view of a wafer 100 according to an exemplary embodiment.

The illustrated wafer 100 may be a semiconductor wafer, in particular a silicon wafer, and may comprise a matrix-like array of a plurality of electronic components 102, such as MEMS chips. A separation frame 104 forms an integral part of the wafer 100, is thereby integrally connected with the electronic components 102 and separates or spaces neighboured or adjacent electronic components 102 from each other. Descriptively speaking, separation frame 104 is a grid-like structure being predominantly formed of semiconductor material of the wafer 100.

Apart from its semiconductor base, the separation frame 104 comprises a laser penetration affecting structure 106 which is configured for locally affecting laser penetration when subjecting the separation frame 104 to laser processing during stealth dicing. In particular when the electronic components 102 are MEMS members which may be functionally disturbed by defect particles and when the thickness D of the wafer 100 is high (for instance above 300 μm), the laser penetration affecting structure 106 may be configured as a defect density suppression structure for suppressing formation of defects during separating the electronic components 102 from the wafer 100, as explained above for instance referring to FIG. 5.

As shown in FIG. 6, the laser penetration affecting structure 106 comprises a metallic pattern in form of stripe-shaped substructures 110 which are located symmetrically with respect to separation lines 112 for trimming a laser beam scanning along the separation lines 112 during stealth dicing. In the presently described embodiment, separation lines 112 extending along two orthogonal directions are shown. Advantageously, the laser penetration affecting structure 106 is configured for locally blocking a laser beam when irradiated onto the separation frame 104. In other words, a laser beam may be blocked to a larger extent from entering the separation frame 104 in a depth direction (i.e. perpendicular to the paper plane of FIG. 6) when impinging on the laser penetration affecting structure 106 compared with a scenario in which the laser beam impinges on the separation frame 104 apart from the laser penetration affecting structure 106.

As already mentioned, the laser penetration affecting structure 106 according to FIG. 6 may be a metallic structure for reflecting a laser beam. Alternatively, a laser beam may be inhibited from propagating in an undisturbed way into an interior of the separation frame 104 by a laser penetration affecting structure 106 embodied as locally highly n- or p-doped region for absorbing at least a major portion of a laser beam. Further alternatively, the laser penetration affecting structure 106 may be composed of dielectric material having a significantly different dielectric constant compared to surrounding material to thereby manipulate a focus position, in particular a focus depth, of the laser beam. Yet another option for the laser penetration affecting structure 106 is to embody it as a surface portion with locally increased surface roughness compared to a smaller surface roughness of surrounding material to thereby defocus the laser beam.

As already mentioned and as shown in FIG. 6, the laser penetration affecting structure 106 of the present embodiment comprises a symmetric and periodic pattern of metallic substructures 110 located along straight separation lines 112 of the separation frame 104 extending along two orthogonal directions. Advantageously, the pattern according to FIG. 6 is a regular, periodic pattern of substructures 110 extending along a straight line, wherein the substructures 110 assigned to a respective straight line correspond to a respective separation line 112. Furthermore, the substructures 110 corresponding to a common separation line 112 may be in alignment with each other and with said separation line 112. As shown, the substructures 110 comprise a plurality of stripe pairs, each stripe pair have having a spacing between its stripes. Furthermore, different ones of the stripe pairs are spaced along a respective one of the one or more straight separation lines 112. The geometry according to FIG. 6 ensures both a reliable separation and a low defect density when cutting along the edges of the electronic components 102. Since the separation trajectory in accordance with separation lines 112 extends straight along the spacings between stripes of the respective stripe pairs, one stripe of a respective stripe pair forms part of an edge region of each of two adjacent separated electronic components 102 after separation.

Advantageously, the pattern of substructures 110 according to FIG. 6 is absent in crossing regions of the separation frame 104. This prevents artefacts 130 concerning uneven breaking surfaces (compare FIG. 4) in corners of the electronic components 102 during separation. Apart from the crossing regions, substructures 110 with a laser shadowing or shielding effect may be implemented.

During separation of wafer 100 into individual electronic components 102 according to FIG. 6, a laser beam is guided along the separation frame 104 in a horizontal direction and in a vertical direction perpendicular to the horizontal direction. For creating candle sticks 134 at different depth levels inside of the wafer 100, the laser beam may be guided a plurality of times (in particular 2 to 7 times) along the separation lines 112 at the separation frame 104 for impacting the wafer 100 at said different depth levels (compare d1-d4 in FIG. 5). Advantageously, the laser beam may be guided along the separation frame 104 so that penetration of the laser beam into the wafer 100 is blocked, partially or entirely, by the laser penetration affecting structure 106. The penetration of the laser beam into the wafer 100 may occur more efficiently apart from the laser penetration affecting structure 106 as compared to the penetration of the laser beam into the wafer 100 at the laser penetration affecting structure 106. To ensure a simple laser control, the laser processing may guide the laser beam continuously along the separation frame 104, so that the laser beam may remain switched on during the entire laser processing in terms of stealth dicing.

Although not shown, the stealth dicing process may continue after completion of the laser processing by radially expanding the wafer 100 to induce fracture at the separation frame 104 to thereby separate the electronic components 102.

Advantageously, formation of the metallic laser penetration affecting structure 106 may be carried out simultaneously with a process of forming a metallic structural feature in the active region 116 of the electronic components 102 during semiconductor processing. For instance, a common lithography may be used for forming part of the active region 116 and at least part of the laser penetration affecting structure 106, for instance during a BEOL process. For instance, a metallic laser penetration affecting structure 106 may be formed by a last metal layer applied in terms of semiconductor wafer processing.

FIG. 6 shows a top view of scribe or separation lines 112 of the wafer 100. Laser penetration affecting structure 106 constitutes a pattern for laser blocking. Each stripe pair has a spacing at a central position indicating a separation position along an assigned separation line 112. Advantageously, no blocking pattern of substructures 110 is present in the vicinity of crossings of the separation frame 104.

As already mentioned, there are different options to affect the penetration of the laser beam by a laser penetration affecting structure 106:

In one embodiment, it may be possible to reflect, shield or block the laser beam, for instance by substructures 110 embodied as metal stripes or stripes made of another reflective material. Since at least one metal is usually always available in almost all semiconductor chip products, a corresponding laser penetration affecting structure 106 may be formed with lowest effort.

A laser penetration affecting structure 106 may also be embodied to absorb infrared (IR) laser light close to the surface by a highly doped implant layer.

In yet another embodiment, a laser penetration affecting structure 106 may be implemented by a thick dielectrics with significantly different $\varepsilon_r$ value, for example silicon nitride ($Si_3N_4$), dislocating the sidewall spots according to Bragg's law.

Additionally or alternatively, it may be possible to form a laser penetration affecting structure 106 by using local roughening of the surface or at an interface within the layer stack to avoid focusing of the laser light onto one spot. For example, this may be achieved by a via wet chemical process or by a damage implant process.

FIG. 7 shows a cross-sectional view of a wafer 100 according to an exemplary embodiment. The embodiment of FIG. 7 shows that the laser penetration affecting structure 106 may be configured for differently affecting laser penetration in different depth levels d1, d2, d3 inside of the separation frame 104. Each of the three illustrations of FIG. 7 shows a scenario in which a respective laser beam 140, 142, 144 is directed onto a surface 146 of an electronic component 102 to be separated from a wafer 100. Separation may be triggered by the formation of candle sticks 134 at the different height levels d1, d2, d3 shown in FIG. 7. For this purpose, a respective laser beam 140, 142, 144 may be focused on a respective one of the different height levels d1, d2, d3. By the different shown designs of substructures 110 of laser penetration affecting structures 106 according to the three examples of FIG. 7, different defect characteristics at the various height levels d1, d2, d3 may be achieved.

With the design shown on the left-hand side of FIG. 7 and being subjected to the impact of laser beam 140, the laser beam 140 is significantly blocked by the substructures 110 when focussed on each of the various height levels d1, d2, d3.

With the design shown in the central part of FIG. 7 and being subjected to the impact of laser beam 142, the laser beam 142 is significantly blocked by the substructures 110 when focussed on height level d1. Upon focusing on height levels d2, d3, the blocking effect of the substructures 110 is significantly less pronounced.

With the design shown on the right-hand side of FIG. 7 and being subjected to the impact of laser beam 144, the laser beam 142 is significantly blocked by the substructures 110 when focussed on height levels d2, d3. Upon focusing on height level d1, the blocking function of the substructures 110 is significantly less pronounced.

Hence, depending on the design of the stripes of substructures 110, it may be possible to block more the highest or the lowest scan positions to optimize the separation rate and breaking strength if desired. When comparing the blocking rate of each laser cone for upper level and lower level scan position, it is possible to see that the blocked area of the laser cone cross section is different for the different cone positions depending on the stripe design.

A skilled person will understand that the cone angle may be much bigger in air compared to silicon, so that FIG. 7 is not to scale in this context. This is shown schematically with reference sign 199 in FIG. 7 illustrating refraction of a laser beam at surface 146. The opening angle above surface 146 is larger than below surface 146. In other words, a flatter or wider funnel is obtained at the top than at the bottom. This is a result of the influence of the dielectric constant on the angle.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:
1. A wafer, which comprises:
a front side and an opposing back side;
an array of a plurality of electronic components; and
a separation frame separating neighboured electronic components;
wherein the separation frame comprises a laser penetration affecting structure configured for locally affecting laser penetration into the wafer from the front side when subjecting the separation frame to laser processing during stealth dicing, and wherein the laser penetration affecting structure comprises plurality of non-electrical substructures spaced apart from one another in a periodic pattern at only the front side.

2. The wafer according to claim 1, wherein the laser penetration affecting structure is a defect density suppression structure for suppressing formation of defects during separating the electronic components from the wafer.

3. The wafer according to claim 1, wherein the laser penetration affecting structure is a breaking strength enhancement structure for enhancing a breaking strength during separating the electronic components from the wafer.

4. The wafer according to claim 1, wherein the laser penetration affecting structure comprises a pattern configured for trimming a laser beam during stealth dicing.

5. The wafer according to claim 1, wherein the laser penetration affecting structure is configured for locally blocking a laser beam when irradiated onto the separation frame.

6. The wafer according to claim 1, comprising at least one of the following features:
wherein the laser penetration affecting structure comprises a metallic structure for reflecting a laser beam;
wherein the laser penetration affecting structure comprises a locally highly doped region for absorbing a laser beam;
wherein the laser penetration affecting structure comprises a dielectric material having a different dielectric constant compared to surrounding material and being configured to manipulate a focus position, in particular a focus depth, of the laser beam;
wherein the laser penetration affecting structure has a locally increased surface roughness compared to surrounding material to thereby defocus a laser beam.

7. The wafer according to claim 1, wherein the laser penetration affecting structure is configured for affecting laser penetration differently in different depth levels inside of the separation frame.

8. The wafer according to claim 1, wherein the laser penetration affecting structure comprises a pattern of substructures located along one or more straight separation lines of the separation frame.

9. The wafer according to claim 8, comprising at least one of the following features:
wherein the pattern is a regular, in particular periodic, pattern of substructures;
wherein the pattern is absent in crossing regions of the separation frame;
wherein the substructures comprise a plurality of stripe pairs, each stripe pair have having a spacing between its stripes, wherein in particular different ones of the stripe pairs are spaced along a respective one of the one or more straight separation lines.

10. An electronic component, which comprises:
a semiconductor body having an upper major surface and a lower major surface;
an active region in and/or on a central portion of the semiconductor body; and a separation frame structure in an edge region of the semiconductor body;

wherein the separation frame structure comprises a laser penetration affecting structure separate from the active region configured for locally affecting laser penetration during subjecting the separation frame structure to laser processing during stealth dicing, and wherein the laser penetration affecting structure comprises a plurality of non-electrical substructures spaced apart from one another in a periodic pattern at only the upper major surface.

11. The electronic component according to claim 10, wherein the electronic component is configured as micro-electromechanical system.

12. The electronic component according to claim 10, wherein the laser penetration affecting structure is arranged along at least part of each of surrounding edges of the semiconductor body.

13. The electronic component according to claim 10, wherein the laser penetration affecting structure is absent in each of corner regions of the semiconductor body.

14. The electronic component according to claim 10, wherein the laser penetration affecting structure is a defect density suppression structure for suppressing formation of defects during separating the electronic component from a wafer.

15. The electronic component according to claim 14, wherein a thickness of the semiconductor body is in a range from 300 μm to 1 mm.

16. The electronic component according to claim 10, wherein the laser penetration affecting structure is a breaking strength enhancement structure for enhancing a breaking strength during separating the electronic component from a wafer.

17. The electronic component according to claim 16, wherein a thickness of the semiconductor body is in a range from 100 μm to 300 μm.

* * * * *